United States Patent [19]

Peter et al.

[11] 4,170,819
[45] Oct. 16, 1979

[54] METHOD OF MAKING CONDUCTIVE VIA HOLES IN PRINTED CIRCUIT BOARDS

[75] Inventors: Anthony E. Peter, Susquehanna, Pa.; Frank A. Shott, Vestal; Robert L. Weiss, Apalachin, both of N.Y.

[73] Assignee: International Business Machines Corporation, Armonk, N.Y.

[21] Appl. No.: 894,468

[22] Filed: Apr. 10, 1978

[51] Int. Cl.$^2$ .................. H05K 1/04; H05K 3/10
[52] U.S. Cl. ........................ 29/625; 174/68.5; 428/901; 427/97
[58] Field of Search .......... 29/62 S; 174/68.5; 427/97, 98; 428/901

[56] References Cited
FOREIGN PATENT DOCUMENTS 1105068  3/1968  United Kingdom ............... 174/68.5
1250839 10/1971  United Kingdom ............... 29/625

Primary Examiner—Francis S. Husar
Assistant Examiner—C. J. Arbes
Attorney, Agent, or Firm—Gerald R. Gugger

[57] ABSTRACT

A printed circuit board is provided with via holes and these holes are provided with a base coat of conductive metal, a coating of insulating material deposited on said base coat, and a second coat of conducting metal deposited on said insulating material. The metal coatings are interconnected to one or more surfaces of the board and the base coat is connected to at least one internal power, ground or signal plane. This via hole construction facilitates the making of engineering changes by simply deleting the interconnection between the metal coatings at the board surface and subsequently connecting the desired point to an alternate point on the circuit board.

4 Claims, 6 Drawing Figures

METHOD OF MAKING CONDUCTIVE VIA HOLES IN PRINTED CIRCUIT BOARDS

BACKGROUND OF THE INVENTION

In the production of printed circuit boards, solid circuits are formed of a conductive material positioned on opposite sides of a boardlike insulating base and one or more metal foil sheets are imbedded internally in the base and function as signal, power or ground planes. In order that electrical connections may be established from the circuit made by the conductor on one side of the board to the conductor on the other side of the nonconducting board as well as to the internal planes, it is common practice to form holes through the board and to conductively connect the circuit conductors and planes through these holes. These holes are called "through holes" or via holes and the connections may be by mechanical means such as rivets, eyelets or pins or by coating means such as electroplating a metallic conductor on the surface of the via hole and subsequently soldering an input/output pin in the plated hole.

A significant problem in high density multilayer printed circuit boards is how to accommodate the need for an engineering change capability. In the early version of the printed circuit board, the connection between a plated via hole and an internal signal, power or ground plane was buried in the board and it was impossible to delete the plane from the circuit to make an engineering change without ruining the board. To overcome this problem, a later board configuration was developed wherein each plated via hole was connected to the signal, power or ground plane by way of an associated redundant plated via hole with the holes being interconnected by a metallic strip on the surface of the board. An engineering change could be made by simply cutting the connector strip on the board surface and changing the wiring. Although this provided improved change capability, the use of redundant vias consumes a substantial amount of total board real estate available for making circuit lines and interconnections thereby severely limiting the overall capability of the board and also conceivably affecting the reliability of the resultant structure. It became evident that an improved via arrangement was needed which would give the desired change capability without using an excess of board real estate.

SUMMARY OF THE INVENTION

The present invention improves the engineering change capability and eliminates the need for redundant vias in printed circuit boards and substantially frees a large amount of real estate for other use and makes the total printed circuit board manufacturing process more reliable.

The base of a multilayer printed circuit board includes first and second laminate materials having at least one ground, power or signal plane sandwiched therebetween. The outer surfaces of the composite includes circuit interconnection points. As a first step, a through hole is drilled in the board and a first copper layer is plated in the through hole making the connection to the interplane and to the circuit pattern on the surface of the composite. Next, a suitable insulating material, such as epoxy, is processed into the through hole to totally enclose the earlier copper layer. This provides an effective electrical insulation from the plate-through copper. After the epoxy is in the hole, a second layer of copper is plated in the through hole and at the ends is plated so that there is at least one junction of the second copper layer which makes contact with the first copper layer, thereby providing electrical continuity therethrough.

In the normal sequence of operations, an input/output pin from a module or other component is inserted in the through hole and solder is applied to the through hole providing the electrical connection between the pin and the internal planes and any circuit areas on the surfaces of the composite board structure. When it is desired to make an engineering change in the connection of the printed circuit board, deletes or cuts are made in those areas where there is interconnection between the interplane and the second layer of plated-through copper, thereby effectively isolating the two layers of copper plating. Then, a suitable wire, or the like, is connected to the solder in the through hole and joined to the proper change position with the structure.

Accordingly, a primary object of the present invention is to provide a novel and improved method for providing metal filled via holes in a printed circuit board.

A further object of the present invention is to provide conductive via holes in a printed circuit board by providing the holes with a base coat of conductive metal, a coating of insulating material deposited on the base coat and a second coat of a conducting metal deposited on the insulating material with the conductive coatings interconnected to one or more surfaces of the board and the base coat connected to at least one internal ground, power or signal plane.

A still further object of the present invention is to provide a novel and improved conductive via hole in a printed circuit board which facilitates the making of an engineering change without the use of a redundant conductive via hole.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
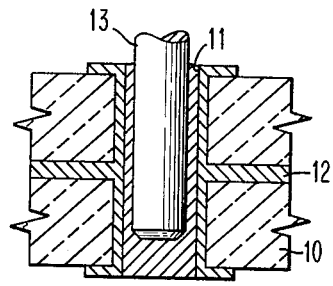
FIG. 1 illustrates in cross section a prior art conductive via hole in a multiplayer printed circuit board.

Referring to FIG. 1, there is illustrated a prior art arrangement wherein a multilayer printed circuit board 10 is provided with a plated via hole 11 which makes conductive connection with metallized circuitry on one or both external surfaces of the board and also with at least one internal ground, power or signal plane 12. A suitable input/output connector 13 is soldered in the hole. In order to make an engineering change with this arrangement, it is necessary to drill through the board to cut and delete a portion of the internal plane from the circuit which was effective but it was not the most desirable method.

Figure 2:
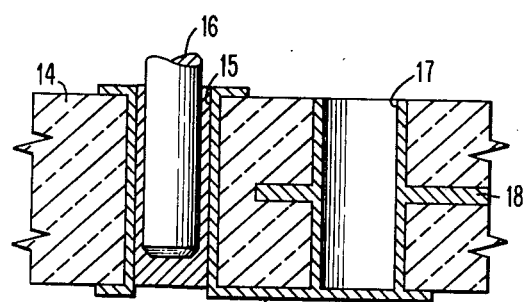
FIG. 2 illustrates in cross section a prior art conductive via hole and associated redundant conductive via hole in a multiplayer printed circuit board.

Referring to FIG. 2, there is illustrated another prior art arrangement wherein a multilayer printed circuit board 14 is provided with a plated via hole 15 which makes conductive connection with metallized circuitry on one or both external surfaces of the board. A suitable input/output connector 16 is soldered in the hole. Also provided is a plated redundant via hole 17 which makes conductive connection with at least one internal ground, power or signal plane 18. The via hole 15 and redundant via hole 17 are conductively interconnected by an external connector strip 19 on the surface of the board. With this arrangement, an engineering change can be made simply by cutting or deleting a portion of external strip 19 between the via holes and rewiring. However, as was mentioned, the use of redundant via holes consumes a substantial amount of board real estate.

Figure 3A:
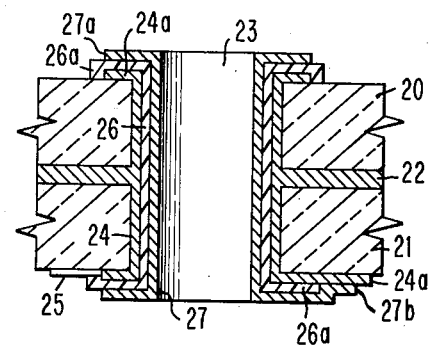
FIGS. 3a–3c illustrate in cross section a conductive via hole in a multilayer printed circuit board and prepared by the method of the present invention.
Figure 3B:
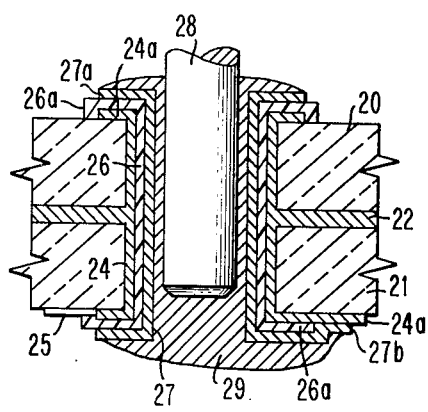
Figure 3C:
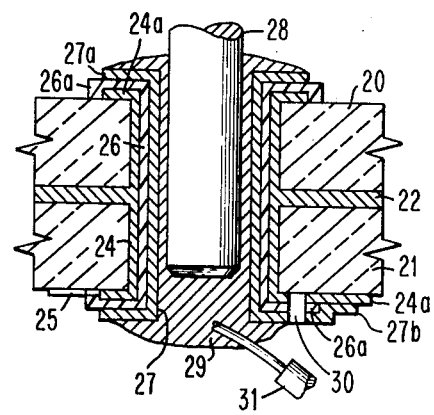

Referring now to FIGS. 3a–3c, there is illustrated the present improved via hole arrangement which facilitates the making of engineering changes without the use of a redundant via hole. The multilayer printed circuit board shown comprises two laminates 20 and 21 of epoxy glass, or the like, which are adhesively secured to a copper foil sheet 22 positioned therebetween. The copper sheet 22 functions as either a ground plane, a signal plane, or a power plane and for simplicity only a single plane is shown, although a plurality of such planes could be utilized with the present concept. Next, one or more through via holes 23 are drilled in the composite board followed by cleaning.

After the via holes are formed, a thin coat of electroless copper is deposited over the entire board and the inner surface of the via holes to provide electrical contact for subsequent electroplating. A photoresist is then applied and developed in an appropriate pattern to everything except the via holes and where metallized circuitry is desired on the surfaces of the board and copper is then electroplated. This results in a coating of copper 24 on the inside surface of the via holes with the coating having land or pad portions 24a on the external surfaces of the board. Also plated is any copper circuitry that may be desired on the external surface of the board, such as indicated at 25. Preferably, all of the printed circuitry is located internally in the board.

The photoresist mask is now dissolved and another application of photoresist is made to mask everything except where it is desired to electrophoretically deposit a resinous insulating material. A coating of insulating material 26, such as epoxy or other suitable organic or insulative materials, is now electrophoretically deposited to completely overlay the copper coating 24 inside the via hole and the coating 26 includes land portions 26a which completely enclose all of the copper lands 24a except the longer one shown on the underside of the board. This particular land is only partially overlaid by the insulative coating. Thus, the copper coating 24 is electrically insulated except for the exposed portion of the longer land.

The second photoresist mask is now dissolved and a thin coating of copper is electrolessly plated in the via hole and on the external surfaces of the board. Then, another photoresist mask is applied followed by the electroplating of copper. This results in a coating of copper 27 which completely covers the insulation coat 26 in the via hole and which has land portions 27a which partially overlap the land portions 26a of the insulating material except for a land portion 27b which overlaps the insulating material 26a and is joined to the exposed portion of the longer copper land 24a to make electrical contact therewith. The photoresist is now dissolved and electroless copper is now stripped by flash etching.

Figure 4:
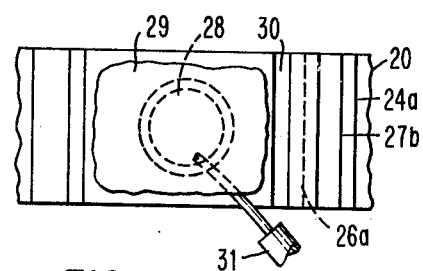
FIG. 4 is a view looking at the underside of the structure shown in FIG. 3c and showing the making of an engineering change.

Referring to FIG. 3b, the composite now has the input/output pin 28 of a module or component secured in the via hole by means of solder 29. Electrical continuity is now established between pin 28, solder 29, copper coating 27, 27b, copper coating 24a, 24, and the internal plane 22. Looking at FIG. 3c, an engineering change can be made by making an external delete cut 30 through the land portions 27b, 26a and 24a which breaks the continuity of the circuit. Then, a suitable wire 31 is connected to the solder 29 and to the desired change point. As shown in FIG. 4, the land portions 24a, 27b and 26a are preferrably rectangular in shape such that the delete 30 is a straight cut through them. However, it will be understood that other configurations of the land portions and the delete cut could be made just as well. Also, the preferred embodiment uses copper for the conductive via coatings; however, other conductive coatings could be used.

While there have been shown and described and pointed out the fundamental novelty features of the invention as applied to the preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

We claim:

1. In a multilayer printed circuit board having a plurality of through via holes therein, a method for making via holes having inherent change capability for connection to a desired change point, comprising:

forming the via holes in said printed circuit board;

depositing a conductive metal in said via holes to provide predetermined interconnections between at least one internal plane and circuit patterns on one or both surfaces of said printed circuit board;

depositing a coating of insulating material to overlay all but a portion of said conductive metal in said via holes; and depositing a second conductive metal to overlay all of said insulating material in said via holes and to contact the exposed portion of said first conductive metal on at least one of the surfaces of said printed circuit board;

making a cut through said layers of first and second conductive metals and insulation material at some point between the via hole and the interconnection between said first and second conductive metals and subsequently connecting the via hole to a desired change point, whereby changes can be made to a selected via hole in said structure.

2. In a multilayer printed circuit board having a plurality of through via holes therein, a method for making via holes having inherent change capability for connection to a desired change point, comprising:

forming the via holes in said printed circuit board;

coating a conductive metal on the inside surface of the via holes with said coating having land portions on one or both external surfaces of the board to provide predetermined interconnections between internal planes of said printed circuit board and circuit patterns on one or both surfaces of said printed circuit board;

coating an insulating material to completely overlay said conductive metal on the inside surface of the via holes and having land portions which completely enclose all of said conductive metal land portions except one associated with each via hole which is left partially exposed; and coating a second conductive metal to overlay said insulating material on the inside surface of the via holes and said insulating material land portions and said exposed portions of said first conductive metal;

making a cut through said coatings of first and second conductive metals and insulation material at some point between the via hole and interconnection between said first and second conductive metals and subsequently connecting the via hole to a desired change point whereby changes can be made to a selected via hole in said board structure.

3. In a multilayer printed circuit board having a plurality of through via holes therein, a method for making via holes having inherent change capability for connection to a desired change point, comprising:

forming the via holes in said printed circuit board;

coating a conductive metal on the inside surface of the via holes with said coating having land portions on one or both external surfaces of the board to provide predetermined interconnections between internal planes of said printed circuit board and circuit patterns on one or both surfaces of said printed circuit board;

coating an insulating material to completely overlay said conductive metal on the inside surface of the via holes and having land portions which completely enclose all of said conductive metal land portions except one associated with each via hole which is left partially exposed;

coating a second conductive metal to overlay said insulating material on the inside surface of the via holes and said insulating material land portions and said exposed portions of said first conductive metal; and soldering input/output pins of components into said via holes whereby electrical continuity is established between the pin, the solder the interconnection of said first and second conductive metal coatings, and an internal plane of said board.

4. The method set forth in claim 3 and including the making of an engineering change by making a cut through said coatings of first and second conductive metals and insulation material at some point between the via hole and the interconnection between said first and second conductive metals and connecting a wire between the solder in the via hole and a desired change point on the board.

* * * * *